United States Patent [19]

Akamatsu

[11] 4,087,703
[45] May 2, 1978

[54] SEMICONDUCTOR SWITCH DEVICE

[75] Inventor: Masahiko Akamatsu, Amagasaki, Japan

[73] Assignee: Mitsubishi Denki Kabushiki Kaisha, Tokyo, Japan

[21] Appl. No.: 704,491

[22] Filed: Jul. 12, 1976

[30] Foreign Application Priority Data

Aug. 28, 1975 Japan .................. 50/104311

[51] Int. Cl.² .............. H03K 17/04; H03K 17/12; H03K 17/60
[52] U.S. Cl. ............................ 307/253; 307/275; 307/314
[58] Field of Search .............. 302/253, 254, 275, 314

[56] References Cited

U.S. PATENT DOCUMENTS

| 3,143,668 | 8/1964 | Bloodworth et al. | 307/253 X |
| 3,681,711 | 8/1972 | Hanby | 307/275 X |

*Primary Examiner*—John Zazworsky
*Attorney, Agent, or Firm*—Oblon, Fisher, Spivak, McClelland & Maier

[57] ABSTRACT

A semiconductor switch device comprising: a main power source for supplying main current; a load connected to one side of said main power source; a semiconductor switch having first and second main current electrodes and a control electrode, the first main current electrode being connected to the other side of the main power source, the semiconductor switch being rendered conductive across the main current electrodes when a forward current is supplied to the control electrode; a current transformer having a core, a primary winding and a secondary winding, the primary winding being connected between the second main current electrode of the semiconductor switch and the load, and the secondary winding being connected at one end to the control electrode of the semiconductor switch, whereby a forward current responsive to the main current flowing in the primary winding is supplied from the secondary winding to the control electrode; and an auxiliary power supply connected between the other end of the secondary winding of the current transformer and the first main current electrode of the semiconductor switch for supplying power to the secondary winding of the current transformer.

13 Claims, 9 Drawing Figures

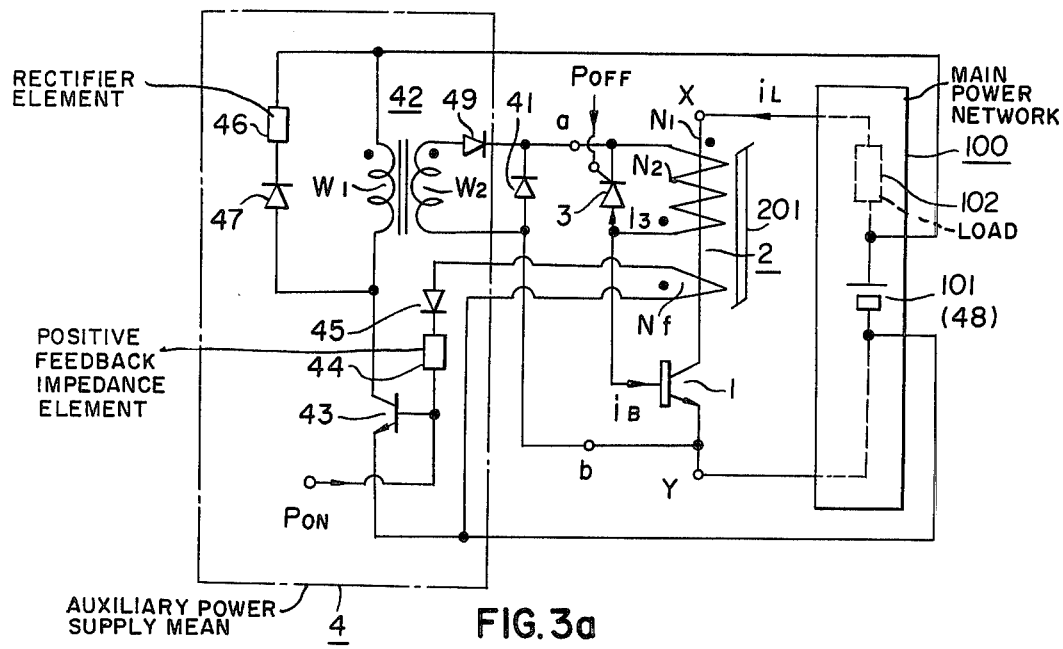
FIG. 3a
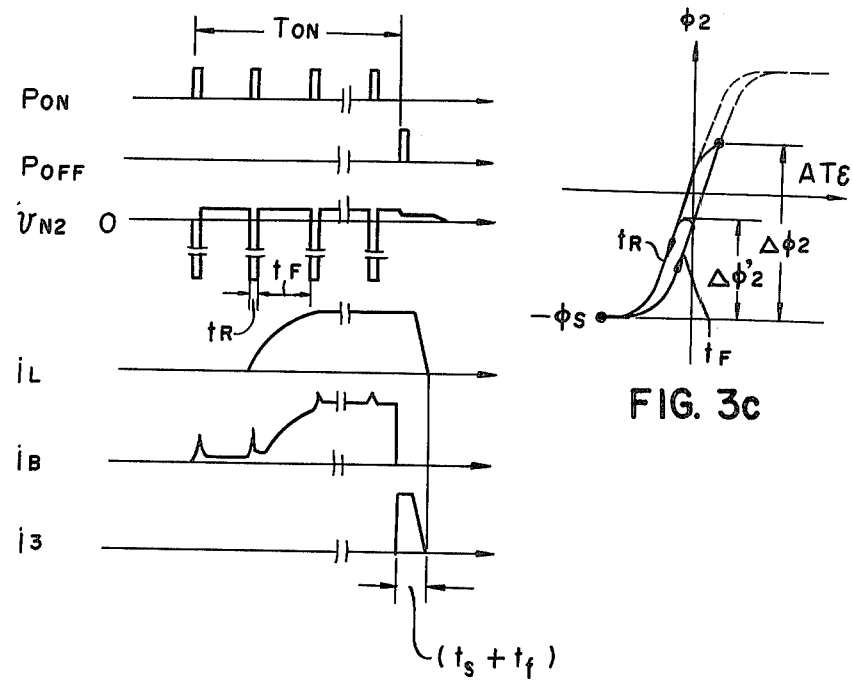
FIG. 3b
FIG. 3c

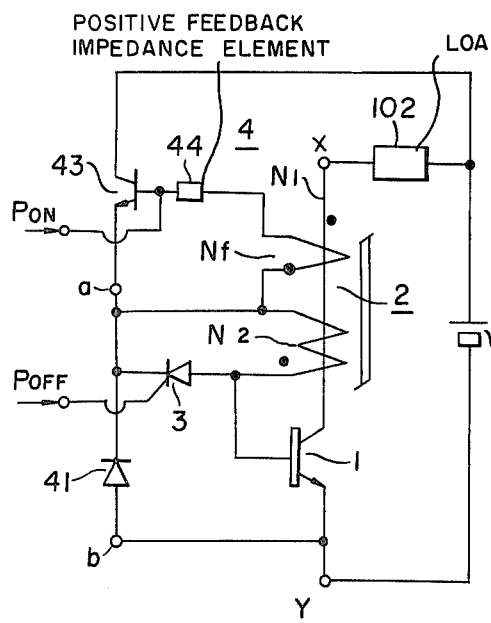
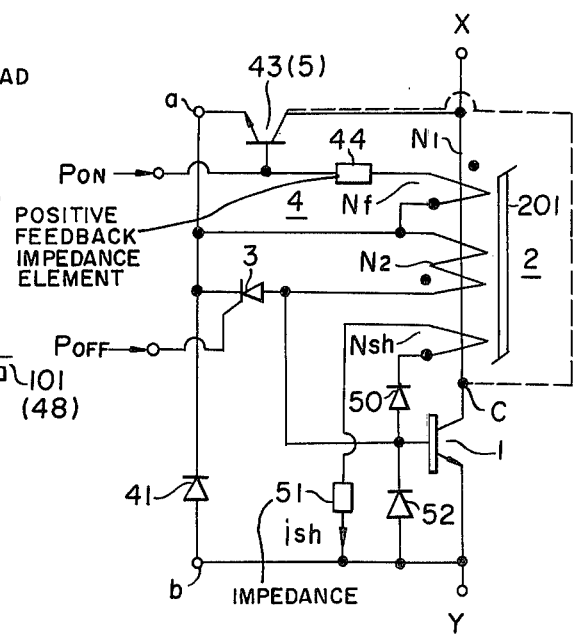
FIG. 4     FIG. 5
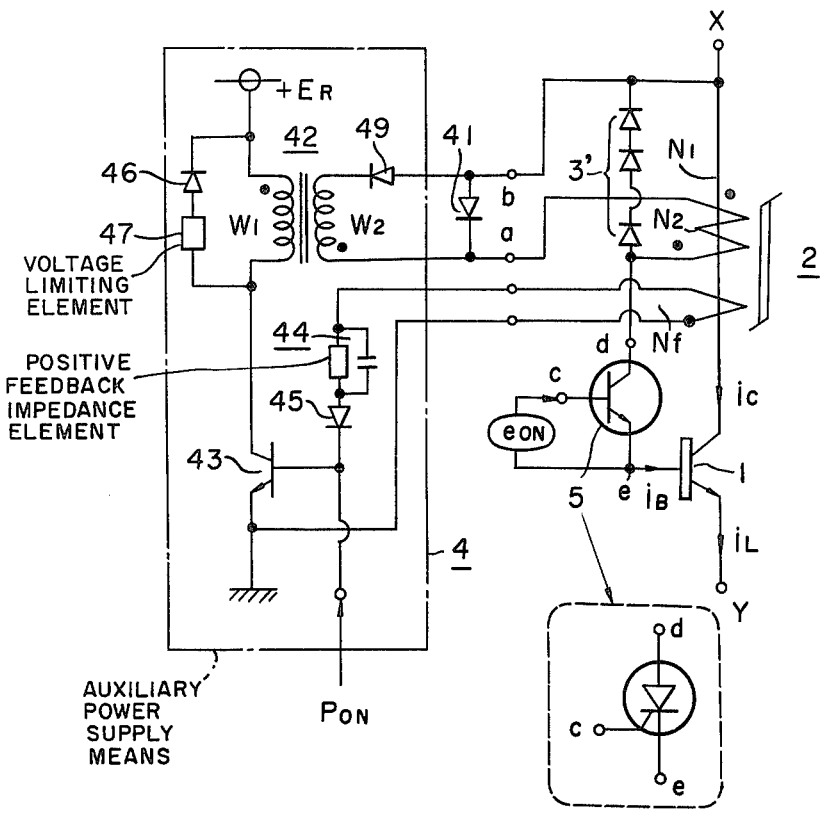
FIG. 6

SEMICONDUCTOR SWITCH DEVICE

BACKGROUND OF THE INVENTION

1. Field of the Invention

The present invention relates to semiconductor switch devices, and more particularly to improvements in power semiconductor devices, e.g., power transistor switch devices, comprising a current transformer for supplying the control electrode current, e.g., the base current.

2. Description of the Prior Art

Power semiconductor switch elements, such as power transistors, must maintain the control electrode current in order to maintain the conductivity of the main current. Large power semiconductor switch elements require intricate means for supplying the control electrode current. Such control electrode current must be large enough to cope with the heaviest possible operating load. To supply a large control electrode current with high efficiency, prior art techniques have proposed the use of a current transformer to thereby self-supply (or replenish) the control electrode current in response to the main current such as the load current and the power switch current. The conventional method for self-supplying the control electrode current by the use of a current transformer depends on an inverter system because the current transformer is only capable of handling AC and not DC components of current.

Prior art techniques have failed to provide systems for supplying the control electrode current through a current transformer is combination with a DC power control chopper, a variable frequency converter or the like, for operation over a wide range of turn-on time ratio.

SUMMARY OF THE INVENTION

It is an object of the invention to provide a semiconductor switch device incorporating a system for supplying a control current through a current transformer, wherein the DC current component can be handled.

It is another object of the invention to provide a semiconductor switch device using simple means capable of handling DC components and enabling the control electrode current to be replenished for operation over a wide range of turn-on time ratio.

The objects of the invention are achieved by a semiconductor switch device comprising a main power source for supplying main current; a load connected to one side of said main power source; a semiconductor switch having first and second main current electrodes and a control electrode, the first main current electrode being connected to the other side of the main power source, the semiconductor switch being rendered conductive across the main current electrodes when a forward current is supplied to the control electrode; a current transformer having a core, and primary winding, and a secondary winding, the primary winding being connected between the second main current electrode of the semiconductor switch and the load, and the secondary winding being connected at one end to the control electrode of the semiconductor switch, whereby a forward current responsive to the main current flowing in the primary winding is supplied from the secondary winding to the control electrode; and an auxiliary power supply connected between the other end of the secondary winding of the current transformer and the first main current electrode of the semiconductor switch for supplying power to the secondary winding of the current transformer.

The invention will hereinafter be described in its preferred embodiments useful for illustrating novel switch devices in which a control DC current is self-replenished continuously over a prolonged period of time in an arbitrary turn-on time ratio. According to the aspect of the invention, a voltage transformer may be utilized for direct coupling power supply operations. Further objects, features and advantages of the invention will become more apparent from the following detailed description when read in conjunction with the accompanying drawings, wherein:

BRIEF DESCRIPTION OF THE DRAWINGS

FIGS. 4 to 6 are circuit diagrams showing other embodiments of the invention.

DETAILED DESCRIPTION OF THE PREFERRED EMBODIMENTS

Figure 1:
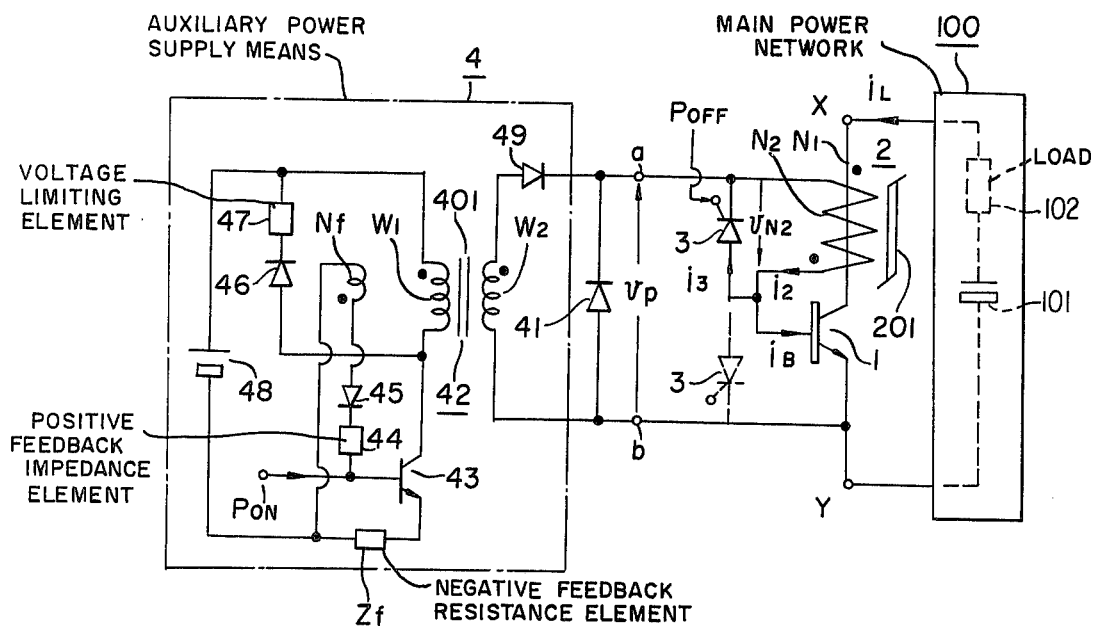
FIG. 1 is a circuit diagram showing one embodiment of the present invention.

With reference to FIG. 1, there is shown a circuit diagram of one embodiment of the semiconductor switch device of the invention, which comprises: a main power network 100 having a main DC power source 101 and a load 102; a power semiconductor switch (e.g., a power transistor) 1 inserted serially in the current path between the power source 101 and the load 102 and having a pair of main current electrodes and a control electrode; and a current transformer 2 having its primary winding $N_1$ inserted serially in the current path and its secondary winding $N_2$ connected to the control electrode of the semiconductor switch 1. The primary winding $N_1$ may be inserted in some other current path in the main power network. The current transformer 2 has a core 201 made of a suitable soft magnetic material such as a soft ferrite, a member of the iron system, or a member of the nickel-iron alloy system. The switch device further comprises a shunt means 3 connected across the secondary winding of the current transformer for shunting the secondary current away from the control electrode of the semiconductor switch. This shunt means may be constituted of a thyristor, transistor or the like. In the circuit, the shunt means 3 can be connected in parallel between a pair of electrode terminals as indicated by the dotted line. Connected to an auxiliary power supply means 4, terminals (a) and (b) are for supplying auxiliary power. It is desirable that the auxiliary power supply means 4 be a pulse power supply means as in this embodiment, which comprises a bypass rectifier element 41, a series rectifier element 49, a pulse transformer 42, a pulse power supply switch 43 (e.g., transistor, thyristor, gate-turn-off thyristor), and an auxiliary DC power source 48. The pulse power supply means further comprises a rectifier element 46 and a voltage limiting element 47, which are used as a means for limiting the reverse pulse voltage of the pulse transfer 42. The voltage limiting element 47 can be a diode, a zener diode, a resistor, a nonlinear resistance element, the parallel combination of a resistor and a capacitor, or the like. The core 401 of the pulse transformer may be formed of a suitable soft magnetic materials as in the core 201 of the current transformer. The pulse power supply means 4 further comprises a means $N_f$ for detecting whether the core 401 and 201 is saturated or nonsaturated. This magnetic detecting means can be, for example, a winding wound on the core 401 or 201.

The circuit shown in FIG. 1 operates in the following manner. To turn on the power semiconductor switch 1, a pulse voltage $V_p$ is applied across terminals (a) and (b) at least in the beginning of the turn-on operation. The pulse voltage $V_p$ causes the control electrode current $i_B$ to start flowing by way of the secondary winding $N_2$ of the transformer 2. As a result, the main current $i_L$ starts to flow, causing the secondary winding current $i_2$ to be increased. By positive feedback in the current transformer, the main current $i_L$ and the control electrode current $i_B$ increase proportionally.

Figure 2A:
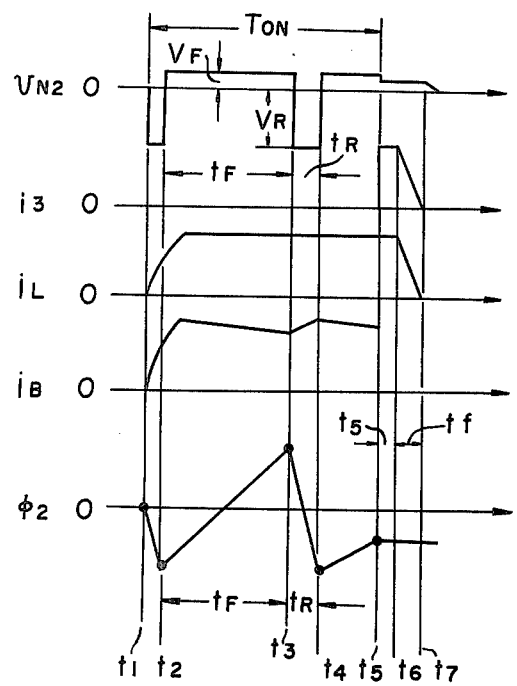
FIGS. 2(a) and 2(b) are waveform diagrams for illustrating the operation of the circuit shown in FIG. 1, FIGS. 3(a) to 3(c) are diagrams showing another embodiment of the invention.

During the period of application of the pulse voltage $V_p$, a voltage equal to the difference between the pulse voltage $V_p$ and the voltage drop between the control electrode and terminal (b) is applied negatively across the secondary winding $N_2$. (Note: The side with the dot (.) mark indicates the positive voltage at the transformer.) This period corresponds to the time interval $t_1 - t_2$ of the waveform shown in FIG. 2(a). The waveforms shown in FIG. 2(a) are plotted under the condition that the initial value of the flux of the core of the current transformer is nearly zero. The waveform $v_{N2}$ is the secondary winding voltage of the current transformer, $i_3$ is the current in the shunt means 3, $i_L$ is the main current, $i_B$ is the control electrode current, and $\Phi_2$ is the core flux of the current transformer.

Figure 2B:
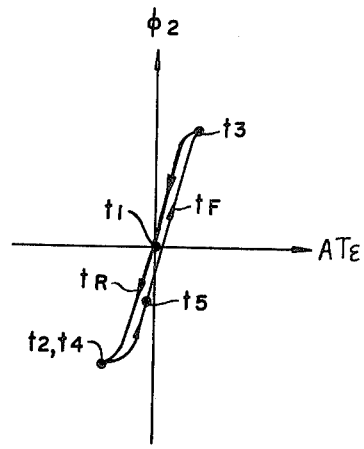

FIG. 2(b) shows $ATe$-$\Phi_2$ characteristic curves of the core 201, where $ATe$ denotes its magnetomotive force, and $\Phi_2$ its flux. Flux levels at times $t_1$ to $t_5$ are indicated by the dots (.).

During the period $t_R$ for which the pulse voltage $V_p$ is applied, the core flux level falls due to the secondary winding voltage. When the application of the pulse voltage $V_p$ is stopped, the core flux level rises as a result of the primary current $i_L$ flow during the period $t_F$ for which the voltage $V_p$ is absent. The voltage VF induced across the secondary winding during the period $t_F$ is the sum $V_{drop}$ of the voltage drop between the output terminals of the pulse power supply means 4 during the period $t_F$ and the voltage drop between the control electrode and terminal (b).

The secondary winding voltage VR present while the pulse voltage VP is being applied is the difference between the voltage $V_{po}$ induced in the pulse power supply means and the voltage drop $V_{drop}$ (i.e., VR = $V_{po} - V_{drop}$). Thus the following relations hold:

$$VF = V_{drop}$$

$$VR = V_{po} - V_{drop} = V_{po} - VF \quad (1)$$

$$VF \cdot t_F = VR \cdot t_R$$

Assume that the pulse voltage $V_p$ is raised and the ratio VR/VF is increased by a factor K. Then the turn-on time $t_{on1}$ to be sustained by the application of one shot of pulse voltage is given as follows (since $t_F = K \cdot t_R$):

$$t_{on1} = t_R + t_F = (1 + K)t_R \quad (2)$$

Assume K < 1, the value being selected from the range of 0.2 to 100 which is readily acceptable for K. Then $t_R > t_F$ when VR < VF. Accordingly, the waveform $V_{N2}$ of FIG. 2(a) is reversed in terms of turn-on time ratio.

When the value of K is small (for example, K < 5), the pulse voltage application time is elongated and, in turn, the pulse voltage may be reduced. While, when the value of K is large (for example, K > 5), the pulse voltage application time is diminished and, in turn, the pulse voltage is raised. When the power for the pulse power supply means 4 is derived from the main DC power source in the main power network, the pulse voltage can readily be set to be high and hence it is desirable that the value of K be determined to be rather high.

If the necessary turn-on period $T_{ON}$ is longer than the period $t_{on1}$ for which the turn-on is sustained by one shot of pulse voltage, it is necessary to apply the pulse voltage $V_p$ repeatedly.

To make the switch element nonconducting, the secondary current $i_2$ is shunted by the shunt means 3. Shunting the secondary current $i_2$ causes the control electrode current $i_B$ to cease. Then the main current $i_L$ is cut off after a turn-off delay including the carrier storage time $t_s$ and the current diminishing time $t_f$. The time sequence of this operation is shown by $t_5$ to $t_7$ in FIG. 2(a).

In the foregoing manner, the control electrode current $i_B$ can be selfreplenished for the desired period of time by the use of a current transformer without causing the flux $\Phi_2$ of the core 201 of the current transformer 2 to be positively saturated.

The operation of the circuit as in FIG. 1, in connection with the pulse power supply means 4, will be described below. When a trigger pulse $P_{ON}$ is applied to the control electrode of the pulse supply switch 43, the switch 43 turns on and the voltage from the auxiliary DC power source 48 is applied to the primary winding $W_1$ of the pulse transformer 42. At the same time, a voltage is induced across the detection winding $N_f$. This detection voltage serves to maintain the conduction of the pulse supply switch 43. When the flux $\Phi_2$ of the core 201 of the current transformer 2 approaches its negative saturation level, the currents in the secondary windings $N_2$ and $W_2$ increase and thereby the current in the primary winding $W_1$ increases. As a result, the voltage drop in the circuit increases, the voltage across the detection winding $N_f$ falls, and the pulse supply switch 43 is rendered non-conducting. For the purpose of smoothly switching the switch 43 from conduction to nonconduction and for suppressing a large peak current, a negative feedback resistance element $Z_f$ may be connected serially to the main electrode of the switch 43 on the side of the control electrode or a differential element (e.g., a capacitor) may be included in the positive feedback impedance 44. Thus the application of the pulse voltage can be automatically stopped immediately when the resetting of the core flux of the current transformer 2 ends.

For the purpose of repeating the pulse voltage $V_p$, the application of trigger pulse $P_{ON}$ may be repeated. When the circuit constants of the feedback network comprising the detecting winding $N_f$, diode 45, impedance 44 and negative feedback resistance element $Z_f$ are suitably determined, the circuit can be self-oscillated to generate a pulse voltage repeatedly and automatically. In other words, an astable multivibrator may be used as the pulse power supply means 4.

Also, as the pulse power supply means 4, a multivibrator or intermittent oscillation modulation system may be used, in which a pulse is repeatedly generated by self-oscillation for the period a specific input signal is present, and such self-oscillation is stopped while the other specific input signal state is present. FIG. 3(a) is a circuit diagram showing another embodiment of the invention, in which the detection winding $N_f$ is wound on the core 201 of the current transformer 2. In this arrangement, the pulse power supply means 4 responds more accurately to the approach of the flux of the core 201 to its saturation level, so as to stop the application of the pulse voltage.

In this embodiment, the DC power source 101 in the main power network is utilized as the DC power source 48 of the pulse power supply means 4. FIG. 3(b) shows waveforms for illustrating the operation of the circuit shown in FIG. 3(a). The trigger pulse $P_{ON}$ is applied repeatedly during the necessary turn-on time. Whereas, to turn off the switch, the pulse $P_{OFF}$ is applied to energize the bypass thyristor 3. When no main current $i_L$ flows during the period $T_{ON}$, almost no control electrode current $i_B$ flows. In this state, the exciting current due to the application of the pulse voltage $V_p$, and the exciting current due to the self-inductance of the core 201 of the current transformer flow during the absence of the pulse voltage $V_p$. As the main current flows, the waveform of the control electrode current $i_B$ rises. To turn off the switch, the secondary current is shunted by the shunt means 3 for the period of delay $(t_s + t_f)$ ascribed to the turn-off in the power semiconductor switch 1.

FIG. 3(c) shows characteristic curves of the core, in which the flux rises to the negative residual flux level at the highest during the period $t_F$ when the main current $i_L$ is absent. The flux change in this case is $\Delta\Phi_2'$. The larger the main current $i_L$, the higher the flux rises during the period $t_F$. The flux change in this state is $\Delta\Phi_2$.

FIGS. 4 and 5 are circuit diagrams showing other embodiments of the invention. In the arrangement shown in FIG. 4, the pulse transformer 42 is eliminated and the main DC power source 101 is used in common. Specifically, an auxiliary power supply means 4 is constituted of the main DC power source 101, the power supply switch 43, the detection winding $N_f$ and the resistor 102.

In the arrangement shown in FIG. 5, the voltage between the terminals X and Y through which the main current is supplied to the power semiconductor switch 1, or the voltage between the main current terminals C and Y indicated by the dotted line is used as the voltage of the pulse power supply means.

The circuits as in FIGS. 4 and 5 operate in the following manner. For the period the power semiconductor switch 1 is off, a pulse voltage is applied to the secondary winding of the current transformer 2 to cause the flux of the core 201 to fall to its negative saturation level. The pulse voltage stopping period $t_F$ during which the flux rises from the negative to positive saturation level is utilized as the effective turn-on time $T_{ON}$. In general, the pulse voltage is applied once for one turn-on, not for continuous turn-on for a prolonged period. In this embodiment, the trigger pulse $P_{ON}$ is first applied to turn on the pulse supply switch 43. The voltage across the switch 43 is applied to the current transformer 2 by way of the secondary winding $N_2$, the diode 50, the shunt winding $N_{sh}$ and the impedance 51. The shunt winding $N_{sh}$ is wound opposite to the secondary winding $N_2$ upon whose polarity the shunt winding depends, and the number of windings of $N_2$ is larger than that of $N_{sh}$. Thus the voltage induced across the shunt winding $N_{sh}$ reversely biases the control electrode of the power semiconductor switch 1 to maintain this semiconductor switch nonconductive. When the flux of the core 201 comes near its negative saturation level, the voltage across the shunt winding $N_{sh}$ falls to a value with which the reverse-biasing of the control electrode of the semiconductor switch 1 ceases. Consequently the power semiconductor switch 1 starts conducting, and its terminal voltage further falls and the semiconductor switch becomes more conducting. In this state, the main current flows in, urging the negative voltage across the current transformer to diminish until it turns into a positive voltage. At the same time, the pulse supply switch 43 becomes nonconducting because the voltage across the feedback winding $N_f$ has become insufficient or the voltage polarity has been reversed. The secondary winding current continues flowing by way of the diode 41, the secondary winding $N_2$ and the power semiconductor switch 1. Thus, in the switch circuit, the current self-replenishing turn-on mode is established.

When the core flux reaches its positive saturation level during the turn-on operation, the control electrode current ceases, causing the power semiconductor switch 1 to return to its nonconducting state. By using the feedback network elements (44 and $N_f$) of differential characteristic or by applying a suitable turn-on pulse signal $P_{ON}$, the pulse supply switch 43 turns on again and core flux returns to the negative saturation level. A series of the above operations is repeated, or the operation in which the semiconductor switch returns to nonconduction for a short period is repeated, to enable a large turn-on time ratio to be realized. For a large turn-on time ratio, for example, the following operation is useful. The secondary winding voltage VF applied during the flux rise period $t_F$ is 2 to 4 V. The pulse voltage VR applied to the secondary winding during the flux falling period is 100 to 400 V. Accordingly, the ratio $t_F/t_R$ or VR/VF is 25 to 200. Therefore the turn-on time ratio $\alpha(=t_F/(t_F + t_R))$ can be 0.95 up to 0.995. This signifies that the semiconductor switch of the invention makes substantially continuous turn-on available.

The semiconductor switch can be made nonconducting at any time when desired, by the use of the shunt means 3.

The above-disclosed uses of the switch device of the invention are highly practicable also for applications such as pulse-width modulation switching where the switch is turned on/off at a given frequency, since this operation is done usually by causing the switch device to be once made nonconducting and then turned on again in the manner described above.

According to the embodiment shown in FIG. 5, the pulse supply switch 43 may be kept conducting during the flux rising on-time $t_F$. In this case, it is necessary to supply the turn-on signal $P_{ON}$ continually, and the feedback winding $N_f$ can be eliminated. In such arrangement, the flux responding function is carried out by the shunt winding $N_{sh}$ to detect whether the core flux reaches its negative saturation level. Further, the bypass rectifier element 41 may be eliminated, and the shunt means 3 can be simplified, comprising a diode, a nonlinear resistance element and a resistor. The control electrode current flows by way of: X-43-$N_2$-1-Y, together with the main current during the period $t_F$. The voltage present across the secondary winding for the period $t_F$ serves to maintain the difference between the voltage drop $V_{drop}$ which is the sum of the voltage drop between the control electrode and terminal (b) and that across the pulse supply switch 43, and the voltage drop $V_{1F}$ across the power semiconductor switch 1. In this form of embodiment, the semiconductor switch can be made nonconducting by turning off the pulse supply switch 43. In this operation, the switch 43 serves also as an auxiliary switch 5 shown in FIG. 6.

Referring to FIG. 6, a circuit diagram is shown to illustrate another embodiment of the invention, in which the auxiliary switch 5 is connected serially to the control electrode of the semiconductor switch 1. The auxiliary switch may be a transistor, thyristor (as indicated in the dotted circle) or the like. The circuit comprises a passive type shunt means 3' used to shunt the residual secondary winding current which remains when the auxiliary switch 5 is cut off.

According to the embodiment shown in FIG. 6, the auxiliary switch 5 is cut off in order to cut off the control electrode current, so as to turn off the power semiconductor switch. Then, to turn on the semiconductor switch 1, the auxiliary switch 5 is turned on and a pulse voltage is applied serially to the secondary winding $N_2$. If necessary, the pulse voltage is applied repeatedly.

In the embodiment shown in FIG. 6, the secondary winding current flows by way of: X-4-$N_2$-5-1-Y, to be added to the main current whereby the secondary winding current serves as part of the main current.

According to the present invention, as has been described above, an auxiliary power supply means is installed serially with the secondary winding of a current transformer to make it possible to prevent the supply of current from being stopped due to the saturation of the core of the current transformer. This permits the transmission of the DC component of power. Furthermore, a detection means capable of operation in response to variation in the flux of the current transformer core is included to control the auxiliary power supply means whereby the period for which the pulse power is supplied is automatically controlled. Thus, with the switch device of the invention, a large turn-on time ratio is realized and continual turn-on operation is made available.

While a few preferred embodiments of the invention and specific modifications thereof have been described, it is to be understood that numerous variations may occur to those skilled in the art without departing from the true spirit of the invention.

What is claimed as new and desired to be secured by letters patent of the United States is:

1. A semiconductor switch device comprising:
   a power source;
   a load;
   a semiconductor switch serially disposed in a current path between the power source and the load, the semiconductor switch having a pair of main current electrodes and a control electrode, the semiconductor switch becoming conductive across the main current electrodes when a forward current is applied to the control electrode;
   a current transformer having a core, a primary conductor serially disposed in the current path and a secondary winding connected to the control electrode whereby a current responding to the current passed through the current path is supplied to the control electrode;
   an auxiliary power pulse supply means connected in series with the secondary winding of the current transformer, the auxiliary power pulse supply means applying a forward polarity pulse to the control electrode;
   detection means operable in response to the flux of the core of the current transformer, the auxiliary power pulse supply means being controlled by the output of the detection means.

2. A semiconductor switch device according to claim 1 wherein the detection means comprises a detection winding wound on the core of the current transformer.

3. A semiconductor switch device according to claim 2 wherein the auxiliary power pulse supply means comprises a DC power source and a power pulse supply switch connected in series to the DC power source and the control electrode of the semiconductor switch through the secondary winding of the current transformer, the power pulse supply switch for controlling the supply of power pulses from the DC power source to the secondary winding being controlled by the detection winding of the current transformer.

4. A semiconductor switch device according to claim 3 wherein the power source is a direct current source and functions also as the auxiliary power pulse supply means.

5. A semiconductor switch device according to claim 3 wherein the voltage between the main current electrodes of the semiconductor switch is applied to the power pulse supply switch.

6. A semiconductor switch device according to claim 5 wherein the semiconductor switch is a transistor and further comprising a shunt winding wound on the core of the current transformer and connected across the base and emitter electrodes of the transistor, the transistor being maintained nonconducting by a voltage induced across the shunt winding.

7. A semiconductor switch device comprising:
   a power source;
   a load;
   a semiconductor switch serially disposed in a current path between the power source and the load, the semiconductor switch having a pair of main current electrodes and a control electrode, the semiconductor switch becoming conductive across the main current electrodes when a forward current is applied to the control electrode;
   a current transformer having a core, a primary conductor serially disposed in the current path and a secondary winding connected to the control electrode whereby a current responding to the current passed through the current path is supplied to the control electrode;
   an auxiliary power pulse supply means connected in series with the secondary winding of the current transformer, the auxiliary power pulse supply means applying a forward polarity pulse to the control electrode;
   a bypass semiconductor switch connected across the secondary winding of the current transformer.

8. A semiconductor switch device according to claim 7 wherein the auxiliary power pulse supply means comprises a DC power source, the primary winding of a pulse transformer and a pulse supply switch connected in series and the secondary winding of the pulse transformer is connected in series to the secondary winding of the current transformer.

9. A semiconductor switch device according to claim 8 further comprising a rectifier element and a voltage limiting element connected in parallel to the primary winding of the pulse transformer.

10. A semiconductor switch device according to claim 8 further comprising a detection winding wound on the core of the pulse transformer to detect whether the core of the pulse transformer is saturated or nonsaturated in order to control the pulse supply switch.

11. A semiconductor switch device according to claim 8 further comprising a rectifier element connected across the secondary winding of the pulse transformer.

12. A semiconductor switch device according to claim 8 wherein the DC power source also functions as the power source for the semiconductor switch.

13. A semiconductor switch device comprising:
a power source;
a load;
a semiconductor switch serially disposed in a current path between the power source and the load, the semiconductor switch having a pair of main current electrodes and a control electrode, the semiconductor switch becoming conductive across the main current electrodes when a forward current is applied to the control electrode;
a current transformer having a core, a primary conductor serially disposed in the current path and a secondary winding connected to the control electrode whereby a current responding to the current passed through the current path is supplied to the control electrode;
an auxiliary power pulse supply means connected in series with the secondary winding of the current transformer, the auxiliary power pulse supply means applying a forward polarity pulse to the control electrode;
an auxiliary switch connecting the secondary winding of the current transformer to the control electrode of the semiconductor switch.

* * * * *